United States Patent
Beach et al.

(10) Patent No.: US 8,940,567 B2
(45) Date of Patent: Jan. 27, 2015

(54) METHOD FOR FABRICATING A III-NITRIDE SEMICONDUCTOR DEVICE

(75) Inventors: Robert Beach, Altadena, CA (US); Zhi He, El Segundo, CA (US); Jianjun Cao, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/159,741

(22) Filed: Jun. 14, 2011

(65) Prior Publication Data

US 2011/0244671 A1 Oct. 6, 2011

Related U.S. Application Data

(62) Division of application No. 11/702,727, filed on Feb. 6, 2007, now Pat. No. 7,973,304.

(51) Int. Cl.
| | |
|---|---|
| H01L 21/00 | (2006.01) |
| H01L 29/772 | (2006.01) |
| H01L 21/02 | (2006.01) |
| H01L 21/285 | (2006.01) |
| H01L 29/49 | (2006.01) |
| H01L 29/778 | (2006.01) |
| H01L 29/20 | (2006.01) |

(52) U.S. Cl.
CPC ........ *H01L 29/772* (2013.01); *H01L 21/02458* (2013.01); *H01L 21/28581* (2013.01); *H01L 21/0254* (2013.01); *H01L 29/4966* (2013.01); *H01L 29/7787* (2013.01); *H01L 29/2003* (2013.01)
USPC ............... 438/46; 438/47; 438/573; 438/590; 257/E21.108

(58) Field of Classification Search
CPC ............ H01L 29/7786; H01L 29/7787; H01L 29/66462; H01L 29/452; H01L 29/772; H01L 29/2003; H01L 21/0254; H01L 21/02458; H01L 21/28581
USPC ....... 438/47, 572, 573, 590, 46; 257/E21.108
See application file for complete search history.

(56) References Cited

U.S. PATENT DOCUMENTS

| | | | | |
|---|---|---|---|---|
| 4,673,593 | A * | 6/1987 | Himoto | 438/605 |
| 5,422,307 | A * | 6/1995 | Ishii | 438/384 |
| 6,075,262 | A * | 6/2000 | Moriuchi et al. | 257/280 |
| 6,878,593 | B2 * | 4/2005 | Khan et al. | 438/285 |
| 7,649,215 | B2 * | 1/2010 | Beach | 257/194 |
| 7,972,915 | B2 * | 7/2011 | Chen et al. | 438/174 |
| 2002/0119610 | A1 * | 8/2002 | Nishii et al. | 438/167 |
| 2006/0006413 | A1 * | 1/2006 | Beach | 257/192 |
| 2006/0081985 | A1 * | 4/2006 | Beach et al. | 257/745 |
| 2007/0018199 | A1 * | 1/2007 | Sheppard et al. | 257/200 |
| 2007/0045689 | A1 * | 3/2007 | Lim et al. | 257/295 |
| 2007/0228415 | A1 * | 10/2007 | Kanamura et al. | 257/192 |
| 2007/0267655 | A1 | 11/2007 | Endoh | |
| 2008/0280405 | A1 | 11/2008 | Tsuchiya | |

FOREIGN PATENT DOCUMENTS

| | | |
|---|---|---|
| JP | 2000-223705 | 8/2000 |
| JP | 2006-237372 | 9/2006 |
| WO | WO 2005/057624 | 6/2005 |
| WO | WO 2006/080109 | 8/2006 |

* cited by examiner

*Primary Examiner* — Michael Trinh
(74) *Attorney, Agent, or Firm* — Farjami & Farjami LLP

(57) ABSTRACT

A III-nitride semiconductor device which includes a barrier body between the gate electrode and the gate dielectric thereof.

10 Claims, 3 Drawing Sheets

METHOD FOR FABRICATING A III-NITRIDE SEMICONDUCTOR DEVICE

This is a divisional of application Ser. No. 11/702,727 filed Feb. 6, 2007, U.S. Pat. No. 7,973,304.

DEFINITION

III-nitride as used herein refers to a semiconductor alloy from the InAlGaN system that includes at least Nitrogen and another alloying element from group III. Examples of a III-nitride alloy are AlN, GaN, AlGaN, InGaN, InAlGaN, or any combination that includes nitrogen and at least one element from group III.

BACKGROUND OF THE INVENTION

The present invention relates to a process for fabricating a power semiconductor device and more particularly a III-nitride power semiconductor device.

A well known III-nitride power semiconductor device includes a substrate, a III-nitride transition layer, and a heterojunction III-nitride device over the transition layer. It is also well known to have an insulated gate over the heterojunction. The insulated gate includes a gate dielectric and a gate electrode.

During the fabrication of a III-nitride device it may be necessary to deposit an etch stop body and selectively remove the etch stop body to make an opening for a gate electrode over the gate dielectric. It is difficult to remove the etch stop body completely without damaging the gate dielectric. Consequently, residual etch stop material may be left over the gate dielectric which may cause undesirable interface states that cause variations in the pinch off or threshold voltage.

SUMMARY OF THE INVENTION

It is an object of the present invention to provide a gated III-nitride device and a process for the fabrication of a device which does not suffer from the drawbacks of the prior art.

A III-nitride power semiconductor device according to the present invention includes a III-nitride active heterojunction; a gate insulation body over the active heterojunction; a barrier body over the gate insulation body; a gate conductive body formed over the barrier body; a first power electrode coupled to the active heterojunction; and a second power electrode coupled to the active heterojunction.

One preferred material for the barrier body is TiN. The barrier body may, however, be composed of Ta, W, Si, Mo, Cr, Co, Pd or an alloy from one of the following systems, TiSiN, TaN, TaSiN, WN, WSiN, and WBN.

A method for fabricating a III-nitride semiconductor device according to the present invention includes forming a gate dielectric body on a III-nitride multi-layer body, the III-nitride multi-layer body including an active III-nitride heterojunction; forming a barrier body over the gate dielectric body; and forming a gate conductive body over the gate barrier body.

Once the gate conductive body is formed, a rapid thermal anneal is applied. The barrier body is selected to protect the gate dielectric during processing, and to prevent the diffusion of material forming the gate conductive body into the gate dielectric.

The use of a barrier body provides for a consistent pinch-off or threshold voltage (Vth), low drain-source leakage, reduced mask count and processing steps, improved scalability, process simplification, and alignment accuracy.

In a III-nitride power semiconductor device according the second embodiment of the present invention, the corners of each power electrode are stuffed with a thin insulation to improve the contact resistance thereof. Thus, in a device according to the second embodiment, each field insulation body adjacent a power electrode includes a lip portion which extends below the power electrode, thereby stuffing the corners thereof. Note that the improvement set forth in the second embodiment may be implemented without a barrier body and still achieve the advantages set forth herein.

Other features and advantages of the present invention will become apparent from the following description of the invention which refers to the accompanying drawings.

DETAILED DESCRIPTION OF THE FIGURES

Figure 1A:
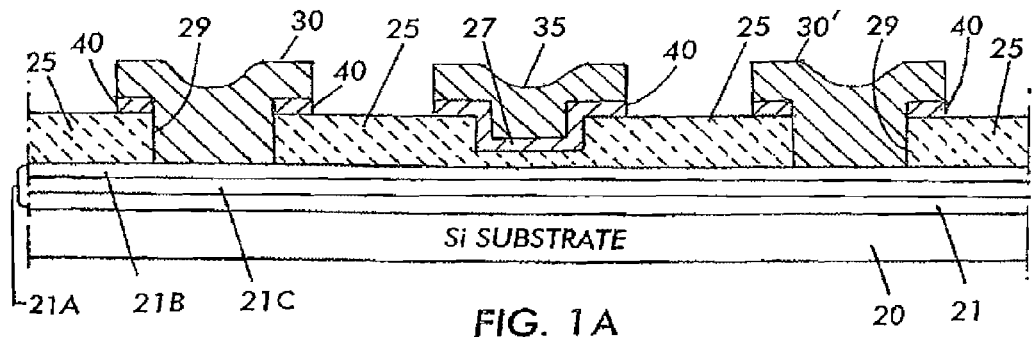
FIG. 1A illustrates a cross-sectional view of a III-nitride device according to the first embodiment of the present invention.

Referring to FIG. 1A, a III-nitride power semiconductor device according to the first embodiment of the present invention includes III-nitride multilayer body 21 formed on a substrate 20. Substrate 20 is preferably formed of silicon, but may be formed of SiC, Sapphire or a III-nitride semiconductor such as GaN. Multilayer body 21 includes a III-nitride active heterojunction 21A. Active heterojunction 21A includes DI-nitride barrier layer 21B (e.g. AlGaN) formed on a III-nitride channel layer 21C (e.g. GaN). As is well known, the thickness and composition of barrier layer 21B and channel layer 21C are selected so that a two-dimensional electron gas (2DEG) is formed in channel layer 21C close to the heterojunction of layer 21B and layer 21C. The current in the device is conducted through the 2DEG. Note that for the sake of simplicity the heterojunction is not specifically illustrated in the remaining figures, but it should be understood that each multilayer 21 includes a III-nitride heterojunction as described herein. Further note that III-nitride multilayer 21 may include a III-nitride transition layer (e.g. formed with AlN), and a III-nitride buffer layer (e.g. GaN layer) disposed between substrate 20 and heterojunction 21A, when for example, substrate 20 is non-native (i.e. is not from the III-nitride semiconductor system) to the III-nitride system. For example, when silicon is used as a substrate material.

A device according to the present invention further includes a first power electrode 30 (e.g. source electrode) coupled ohmically to heterojunction 21B and second power electrode 30' (e.g. drain electrode) coupled ohmically to heterojunction 21A whereby current may be conducted between electrode 30, 30' through the 2DEG. A gate dielectric body 27 is disposed over heterojunction 21A through which gate conductive body 35 can be capacitively coupled to the 2DEG in order to interrupt (depletion mode) or restore (enhancement mode) the same depending on the type of device.

According to an aspect of the present invention, a barrier body 40 is disposed between gate conductive body 35 and gate dielectric 27. Barrier body 40 and gate conductive body 35 are both electrically conductive, and together form the gate electrode of the device. One preferred material for barrier body 40 is TiN. Barrier body 40 may, however, be composed of Ta, W, Si, Mo, Cr, Co, Pd or an alloy from one of the following alloy systems, TiSiN, TaN, TaSiN, WN, WSiN, and WBN.

A device according to the preferred embodiment further includes field dielectric bodies 25. Each field dielectric is disposed between a power electrode 30, 30' and gate conductive body 35. As illustrated field dielectric body 25 is thicker than gate dielectric 27. Also, in the preferred embodiment barrier body 40 extends from gate dielectric 27 along a field dielectric body 25 and over a portion thereof. Gate conductive body 35 also extends over the portion of barrier body 40 that is extended over a field dielectric body 25. Note that each electrode 30, 30' also rises along adjacently disposed field dielectric bodies 25 and over a portion thereof. Optionally, barrier bodies 40 are tucked under portions of electrodes 30, 30' each between a field dielectric body 25 and a portion of an electrode 30, 30'.

Figure 1B:
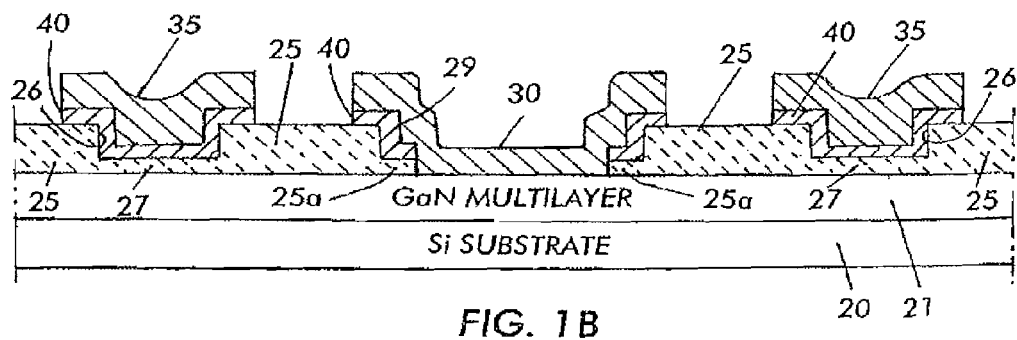
FIG. 1B illustrates a cross-sectional view of a III-nitride device according to the second embodiment of the present invention.

Referring now to FIG. 1B, according to another embodiment of the present invention, each field dielectric bodies 25 adjacent an electrode (e.g. electrodes 30) can include a lip portion 25a extending from a sidewall thereof toward the electrode. A barrier body 40 can then extend from over a lip 25a along the sidewall of field dielectric 25 to a position under that portion of the electrode that is over the field dielectric. Note that the distance a between the sidewalls of field dielectric bodies 25 is wider than the distance b between the ends of lip portions 25a.

Figure 1C:
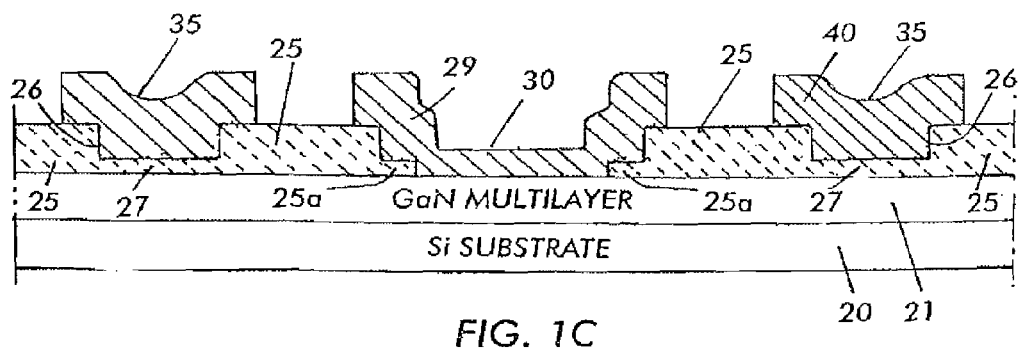
FIG. 1C illustrates a cross-sectional view of a III-nitride device according to a variation of the second embodiment.

Referring to FIG. 1C, in which like numerals identify like features from the previous embodiment, a variation of a device according to the second embodiment does not include barrier body 40.

Figure 2:
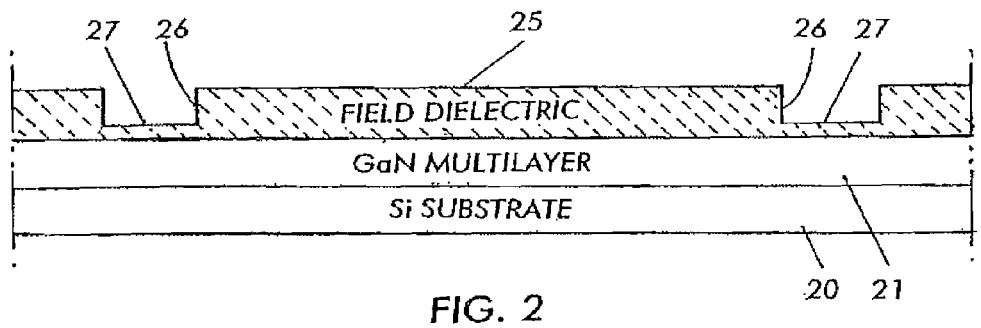
FIGS. 2-4 illustrate selected steps in the process for fabrication of a III-nitride device according to first embodiment of the present invention.
Figure 3:
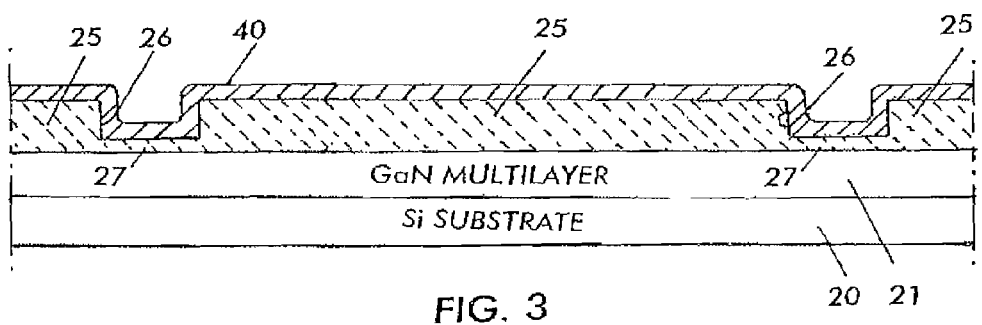
Figure 4:
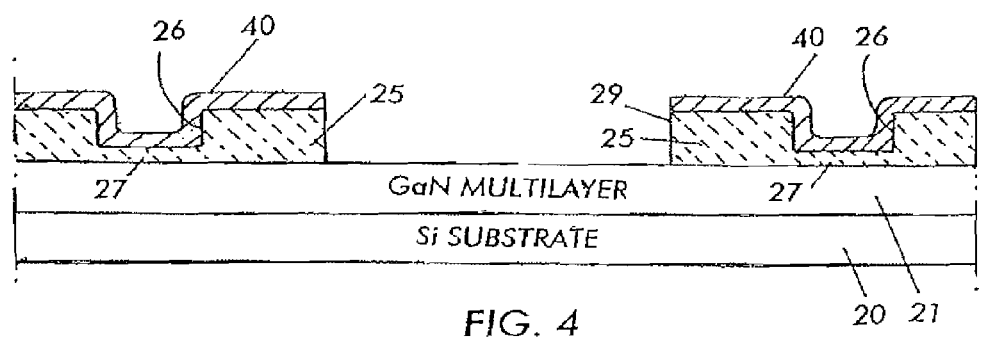

Referring now to FIGS. 2-4, to fabricate a device according to the first embodiment, first a thick field dielectric layer is formed on a multilayer 21 that is present over a substrate 20. The field dielectric layer may be formed with $SiO_2$, $Si_3N_4$, or the like material which may be deposited on multilayer 21. After its deposition, the field dielectric layer is patterned to include openings 26 therein in any desired manner. Note that the patterning of the field dielectric layer results in the formation of field dielectric bodies 25. After openings 26 are formed, gate dielectric bodies 27 are formed at the bottom of each opening over multilayer 21. Gate dielectric bodies 27 may be formed with $SiO_2$, $Si_3N_4$, or the like and formed through deposition or the like process.

Next, barrier body 40 (e.g. TiN) is deposited to line field dielectric bodies 25, and gate dielectric bodies 27 as illustrated by FIG. 3. Barrier body 40 may be deposited using any desired method such as sputtering, chemical vapor deposition, e-beam evaporation, atomic layer deposition, or the like. Thereafter, as illustrated by FIG. 4, openings 29 are formed to extend through barrier body 40, and field insulation bodies 25 thereunder. Each opening 29 is for receiving a power electrode, e.g., power electrode 30, 30'.

Next, an appropriate material (e.g. aluminum) layer is deposited over the arrangement shown by FIG. 4, patterned and then the arrangement is subjected to a rapid thermal anneal (RTA) to obtain a device according to the first embodiment of the present invention as illustrated by FIG. 1A. Note that barrier body 40 is selected to be thermally stable during the RTA. Also, advantageously barrier body 40 prevents the diffusion of material from gate conductive body into gate dielectric bodies 27.

Figure 5:
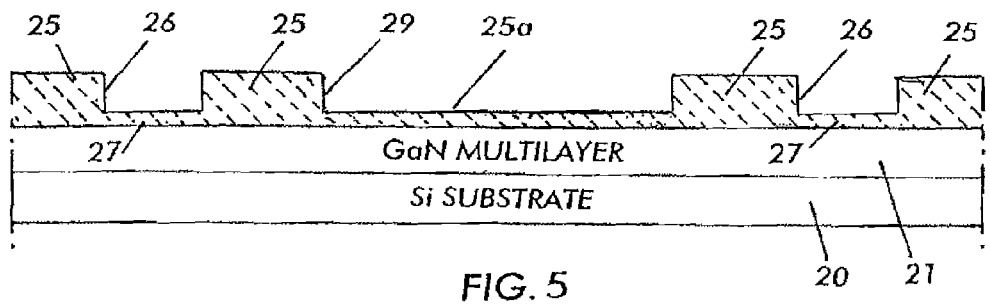
FIGS. 5-7 illustrate selected steps in the process for fabrication of a III-nitride device according to the second embodiment of the present invention.
Figure 6:
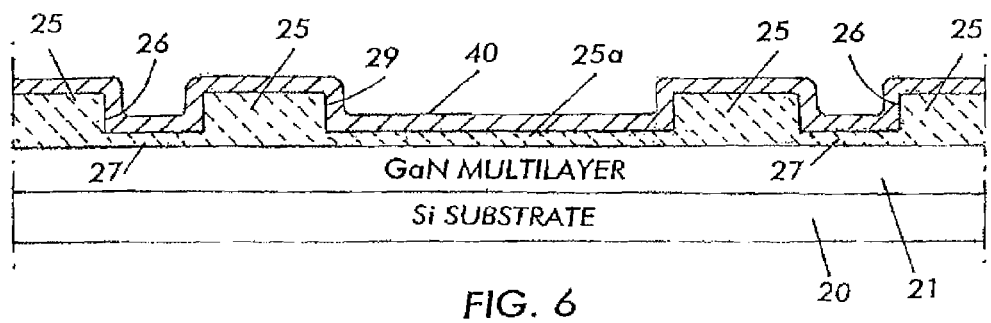
Figure 7:
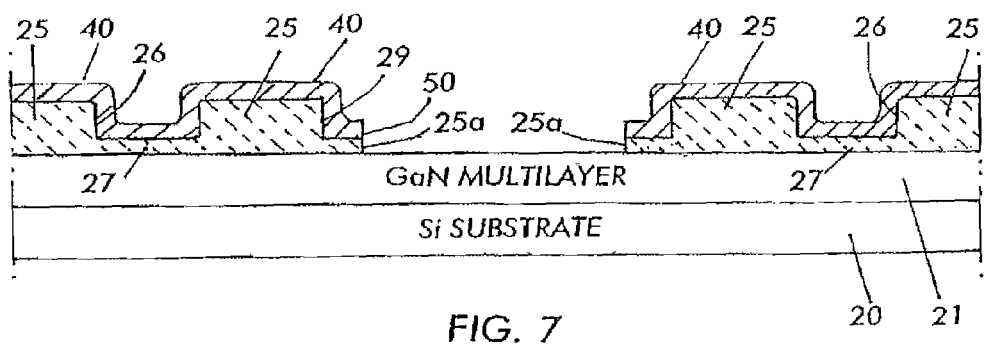

Referring now to FIGS. 5-7, alternatively, openings 29 are made in the field dielectric layer at the same time as openings 26 are made. Thereafter, an insulation body for forming lips 25a is formed at the bottom of openings 29 at the same time gate dielectric bodies 27 are formed followed by the formation of barrier layer 40. Barrier layer 40 and a portion of dielectric 25a are then removed from the bottom of opening 29 resulting in lips 25a and barrier body 40 formed thereover. A suitable material (e.g. aluminum) layer is then deposited over the structure shown by FIG. 6, and patterned to obtain a device according to the second embodiment as illustrated by FIG. 1B

To obtain a device according to the variation illustrated by FIG. 1C, the formation of barrier body 40 may be eliminated from the process illustrated by FIGS. 5-7. In all other respects, a process for obtaining a device according to FIG. 1C is the same as the process described above for the second embodiment of the present invention.

In a device according to the second embodiment, having a thick field dielectric adjacent the gate conductive body reduces the gate charge (similar to the first embodiment), while having a thin dielectric (dielectric lips 25a) result in low ohmic contact resistance. Note that a device according to the second embodiment may be devised without a barrier layer 40, but still include the advantage of having low ohmic contact resistance.

It should be noted that while in the preferred embodiment disclosed herein lips 25a may have the same thickness as the gate dielectric of the device, from a functionality perspective lips 25a are only required to be thinner than the field insulation bodies. Moreover, while it is preferred to have lips 25a of uniform thickness, lips 25a do not need to have a uniform thickness to be within the scope of the present invention.

Furthermore, while it is preferred to form gate conductive body 35, and power electrodes 30,30' from a metal such as aluminum, it is also possible to form gate conductive body 35 from one of N+GaN, Si, Ge, P+GaN, and a combination of N+GaN and a metal body.

Heavily doped sputter deposited GaN can form a good ohmic contact and may be used as a part of power electrodes 30,30'. A sputter deposited heavily doped GaN, when used as a gate conductive body, would allow for the integration of a process for forming good ohmic contact for the power electrodes and a conductive gate body. As a further enhancement, a metal body such as an aluminum body formed atop the heavily doped GaN ohmic electrodes or heavily doped GaN gate conductive body could further shunt the resistance thereof.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of fabricating a III-nitride semiconductor device, said method comprising:

forming a field dielectric body and a gate dielectric body on a III-nitride multi-layer body, said III-nitride multi-layer body including an active III-nitride heterojunction;

forming a barrier body over said gate dielectric body and a portion of said field dielectric body;

forming a conductive gate body over said barrier body, said conductive gate body and said barrier body forming a gate electrode, wherein said barrier body prevents diffusion of said conductive gate body into said gate dielectric body;

forming a power electrode, wherein a portion of said barrier body is disposed between said power electrode and said field dielectric body.

2. The method of claim 1, wherein said barrier body is formed by depositing a barrier metal.

3. The method of claim 2, wherein said barrier metal prevents damage to said gate dielectric during a rapid thermal anneal.

4. The method of claim 2, wherein said barrier metal comprises TiN.

5. The method of claim 1, wherein said barrier body comprises at least one metal selected from the group consisting of Ta, W, Si, Mo, Cr, Co, and Pd.

6. The method of claim 1, wherein said barrier body comprises at least one alloy selected from the group consisting of TiSiN, TaN, TaSiN, WN, WSiN, and WBN.

7. The method of claim 2, wherein said barrier metal is deposited by sputtering.

8. The method of claim 2, wherein said barrier metal is deposited by chemical vapor deposition.

9. The method of claim 2, wherein said barrier metal is deposited by e-beam evaporation.

10. The method of claim 2, wherein said barrier metal is deposited by atomic layer deposition.

\* \* \* \* \*